(12) United States Patent
Lee et al.

(10) Patent No.: US 11,525,854 B2
(45) Date of Patent: Dec. 13, 2022

(54) INTEGRATED CIRCUIT HAVING RECEIVER JITTER TOLERANCE ("JTOL") MEASUREMENT

(71) Applicant: Rambus Inc., San Jose, CA (US)

(72) Inventors: Hae-Chang Lee, Los Altos, CA (US); Jaeha Kim, Los Altos, CA (US); Brian Leibowitz, San Francisco, CA (US)

(73) Assignee: Rambus Inc., San Jose, CA (US)

( * ) Notice: Subject to any disclaimer, the term of this patent is extended or adjusted under 35 U.S.C. 154(b) by 0 days.

(21) Appl. No.: 17/241,660

(22) Filed: Apr. 27, 2021

(65) Prior Publication Data

US 2021/0318371 A1 Oct. 14, 2021

Related U.S. Application Data

(63) Continuation of application No. 16/665,179, filed on Oct. 28, 2019, now Pat. No. 11,022,639, which is a continuation of application No. 15/699,874, filed on Sep. 8, 2017, now Pat. No. 10,466,289, which is a continuation of application No. 15/209,494, filed on Jul. 13, 2016, now Pat. No. 9,791,492, which is a continuation of application No. 13/621,783, filed on Sep. 17, 2012, now Pat. No. 9,423,441, which is a continuation of application No. 12/529,320, filed as application No. PCT/US2008/057455 on Mar. 19, 2008, now Pat. No. 8,289,032.

(60) Provisional application No. 60/895,860, filed on Mar. 20, 2007.

(51) Int. Cl.
*G01R 23/00* (2006.01)
*G01R 29/26* (2006.01)
*G01R 31/317* (2006.01)

(52) U.S. Cl.
CPC ....... *G01R 29/26* (2013.01); *G01R 31/31709* (2013.01); *G01R 31/31725* (2013.01)

(58) Field of Classification Search
CPC .............. G01R 31/31709; G01R 29/26; G01R 31/31725; G01R 31/31922
See application file for complete search history.

(56) References Cited

U.S. PATENT DOCUMENTS

| 5,394,106 A | 2/1995 | Black et al. |
| 5,481,563 A | 1/1996 | Hamre |
| 5,654,657 A | 8/1997 | Pearce |
| 5,793,822 A | 8/1998 | Anderson et al. |

(Continued)

FOREIGN PATENT DOCUMENTS

| CA | 2302102 | 9/2000 |
| JP | 2004-537054 | 12/2004 |
| JP | 2005-233933 A | 9/2005 |

OTHER PUBLICATIONS

Agilent N4972A Clock Synthesizer 16 GHz Data Sheet, Agilent Technologies, Inc., Published Oct. 25, 2012. 11 Pages.

(Continued)

*Primary Examiner* — Alesa Allgood

(57) ABSTRACT

An integrated circuit capable of on-chip jitter tolerance measurement includes a jitter generator circuit to produce a controlled amount of jitter that is injected into at least one clock signal, and a receive circuit to sample an input signal according to the at least one clock signal. The sampled data values output from the receiver are used to evaluate the integrated circuit's jitter tolerance.

20 Claims, 8 Drawing Sheets

(56) References Cited

U.S. PATENT DOCUMENTS

| | | |
|---|---|---|
| 6,285,726 B1 | 9/2001 | Gaudet |
| 6,377,644 B1 | 4/2002 | Naudet |
| 6,718,497 B1 | 4/2004 | Whitby-Strevens |
| 6,760,389 B1 | 7/2004 | Mukherjee et al. |
| 7,487,055 B2 | 2/2009 | Le-Gall |
| 7,519,138 B2 | 4/2009 | Lee et al. |
| 7,549,101 B2 | 6/2009 | Chiba |
| 7,596,173 B2 | 9/2009 | Ishida et al. |
| 7,636,387 B2 | 12/2009 | Yamaguchi et al. |
| 7,952,516 B2 | 5/2011 | Atherton |
| 8,072,253 B2 | 12/2011 | Kaeriyama et al. |
| 8,170,157 B2 | 5/2012 | Menolfi et al. |
| 9,423,441 B2 | 8/2016 | Lee et al. |
| 2004/0203559 A1 | 10/2004 | Stojanovic et al. |
| 2004/0223559 A1 | 11/2004 | Hill |
| 2005/0031029 A1 | 2/2005 | Yamaguchi et al. |
| 2005/0034044 A1 | 2/2005 | Niijima |
| 2005/0058234 A1 | 3/2005 | Stojanovic |
| 2005/0129104 A1* | 6/2005 | Ishida ............... G01R 31/31709 375/224 |
| 2005/0156586 A1 | 7/2005 | Kanbayashi |
| 2005/0156622 A1 | 7/2005 | Roziere et al. |
| 2005/0193290 A1 | 9/2005 | Cho et al. |
| 2005/0267696 A1* | 12/2005 | Yamaguchi ............ G01R 29/26 702/57 |
| 2006/0059392 A1 | 3/2006 | Kizer et al. |
| 2006/0247906 A1 | 11/2006 | Austin et al. |
| 2007/0025487 A1 | 2/2007 | Chiba |
| 2007/0118315 A1 | 5/2007 | Panis et al. |
| 2007/0230513 A1* | 10/2007 | Talbot ................... H04L 7/0337 370/516 |
| 2008/0151981 A1* | 6/2008 | Ichiyama ......... G01R 31/31709 375/226 |
| 2009/0198924 A1 | 8/2009 | Tsern et al. |
| 2010/0039157 A1 | 2/2010 | Kaeriyama et al. |
| 2010/0097071 A1 | 4/2010 | Lee et al. |

OTHER PUBLICATIONS

EP Extended EP Search Report dated Jul. 22, 2011 re EP Application No. 11165959.5. 6 Pages.

EP Office Action dated Feb. 17, 2010 re EP 08744054.1-2216. 5 pages.

EP Response dated Feb. 13, 2012 to the Official Communication dated Jul. 22, 2011 re EP Application No. 11165959.5 includes New Claims (highlighted and clear copy) and New Description pages. 14 pages.

EP Response to the Official Communication of Feb. 17, 2010, dated Aug. 18, 2010 for EP Application No. 08744054.1 (Includes both highlighted and clear copies of new claims, as well as new description pages). 21 pages.

Examination Report dated Feb. 17, 2010, European Patent Office, European Patent Application No. 08 744 054.1-2216 filed Mar. 19, 2008, 5 pages.

Jitter Tolerance Testing with Agilent 81250 ParBERT, Application Note, Jitter Fundamentals, Agilent Technologies, printed Dec. 2, 2003. 13 Pages.

JP Office Action dated Dec. 26, 2012 in JP Application No. 2009-554706. 3 pages.

Shaeffer, Ian, U.S. Appl. No. 12/424,442, filed Apr. 15, 2009 re Notice of Allowance and Fee(s) Due dated Nov. 6, 2009. 25 pages.

Understanding Jitter and Wander Measurements and Standards, Second Edition, Agilent Technologies UK Ltd. printed Feb. 1, 2003. 140 Pages.

* cited by examiner

INTEGRATED CIRCUIT HAVING RECEIVER JITTER TOLERANCE ("JTOL") MEASUREMENT

CROSS-REFERENCE TO RELATED APPLICATIONS

This application is a continuation of U.S. patent application Ser. No. 16/665,179, filed on Oct. 28, 2019, which is a continuation of U.S. patent application Ser. No. 15/699,874, filed on Sep. 8, 2017 (issued on Nov. 5, 2019 as U.S. Pat. No. 10,466,289), which is a continuation of U.S. patent application Ser. No. 15/209,494, filed on Jul. 13, 2016 (issued on Oct. 17, 2017 as U.S. Pat. No. 9,791,492), which is a continuation of U.S. patent application Ser. No. 13/621,783, filed on Sep. 17, 2012 (issued on Aug. 23, 2016 as U.S. Pat. No. 9,423,441), which is a continuation of U.S. patent application Ser. No. 12/529,320 (issued on Oct. 16, 2012 as U.S. Pat. No. 8,289,032), which is a national stage entry of Patent Cooperation Treaty application no. PCT/US08/57455, filed on Mar. 19, 2008 and which claims priority to U.S. Provisional Application No. 60/895,860, filed on Mar. 20, 2007. Each of these prior applications is entitled "Integrated Circuit Having Receiver Jitter Tolerance ('JTOL') Measurement" and names inventors Hae-Chang Lee, Jaeha Kim, and Brian Leibowitz. Each of these prior applications is incorporated by reference.

FIELD OF THE INVENTION

The present invention generally relates to integrated circuits and/or high speed signaling of such circuits.

BACKGROUND OF THE RELATED ART

An integrated circuit may be evaluated by its tolerance to noise or jitter in a received signal. An integrated circuit's, and or system's, performance may be measured by measuring a number of erroneous bits (or erroneous data values) that occur during the transfer of a particular number or bits. This performance metric is known as a Bit-Error-Ratio ("BER") value.

An integrated circuit's (or system's) BER value may be measured by an expensive specialized test system. The cost of the test system and the time required in testing performance of an integrated circuit under a variety of test conditions may significantly contribute to the overall cost of manufacturing the integrated circuit.

FIG. 1 illustrates a test system 100 for testing a device under test ("DUT") 140, such as a semiconductor integrated circuit ("IC"). In particular, test system 100 may be used to obtain a BER value for DUT 140 when particular jitter signals are introduced. Test system 100 includes a BER test equipment 120, a signal generator 110, a random jitter ("RJ") source 108, a sinusoidal jitter ("SJ") source 109, a sum circuit 111 and a backplane 130. Signal generator 110, source 108 and source 109 may be included in BER test equipment 120.

In a test mode, DUT 140 is coupled to BER test equipment 120. One or more receivers 142 of DUT 140 is coupled to one or more transmitters 120A of BER test equipment 120 by way of backplane 130. One or more transmitters 144 of DUT 140 are coupled to one or more receivers 120B of BERT 120 by way of an interconnect (such as a cable). Backplane 130 may provide a known deterministic jitter ("DJ") or noise to data signals transferred from BER test equipment 120 to DUT 140. Backplane 130 may introduce inter-symbol-interference ("ISI") which DUT 140 may encounter in a system when receiving and/or transferring data signals.

Sum circuit 111 sums random noise or an RJ signal and a sinusoidal signal or SJ signal from sources 108 and 109 and outputs a delay control signal. Signal generator 110 outputs a noisy clock signal (or transmit clock/frequency) to transmitter 120A that outputs a data signal in response to the data value provided by pseudo random bit sequence ("PRBS") generator 120C.

A "noisy" clock signal is provided to transmitter 120A (or a clock signal that has been modulated with one or more jitter signals) to observe the tolerance of the receivers 142 to jitter (RX JTOL) or BER performance of DUT 140. For example, data signals are transmitted from BER test equipment 120 to DUT 140 in response to the noisy clock signal. DUT 140 receives the data and then retransmits the data values (the data values may be first stored in a storage circuit of DUT 140) back to the receiver 120B. A compare circuit 120D then outputs an error signal when the data value from receiver 120B does not match or equal the original transmitted data from PRBS generator 120C (PRBS generator 120C may also include a storage circuit to store data values that were output by transmitter 120A). A number of bit (data value) errors or error signals per number of data values transmitted/received by BER test equipment 120 equals a BER value corresponding to the RJ, SJ, and DJ that corrupt the data signal.

It is desirable to measure an integrated circuit's noise tolerance without the use of expensive specialized test equipment. The elimination and/or reduction of the expensive specialized test equipment then may reduce the cost and time in manufacturing/testing an integrated circuit.

BRIEF DESCRIPTION OF THE DRAWING

Embodiments are illustrated by way of example, and not by way of limitation, in the figures of the accompanying drawing. Like reference numerals refer to similar elements.

DETAILED DESCRIPTION

The jitter tolerance (JTOL) of a receiver (RX) is an industry standard measure of how much unwanted timing noise (jitter) the RX can tolerate while achieving a target bit-error-ratio (BER). There are three major components of jitter involved in JTOL testing—Random Jitter (RJ), Deterministic Jitter (DJ), and Sinusoidal Jitter (SJ). While a controlled amount of DJ can be introduced into a high-speed data stream by passing the data stream though a channel (e.g. a PCB trace) that adds inter-symbol interference (ISI), the introduction of RJ and SJ often require expensive equipment. Furthermore, it is desired that the amount of RJ and SJ as well as the frequency of the SJ be variable to fully characterize the RX.

Figure 1:
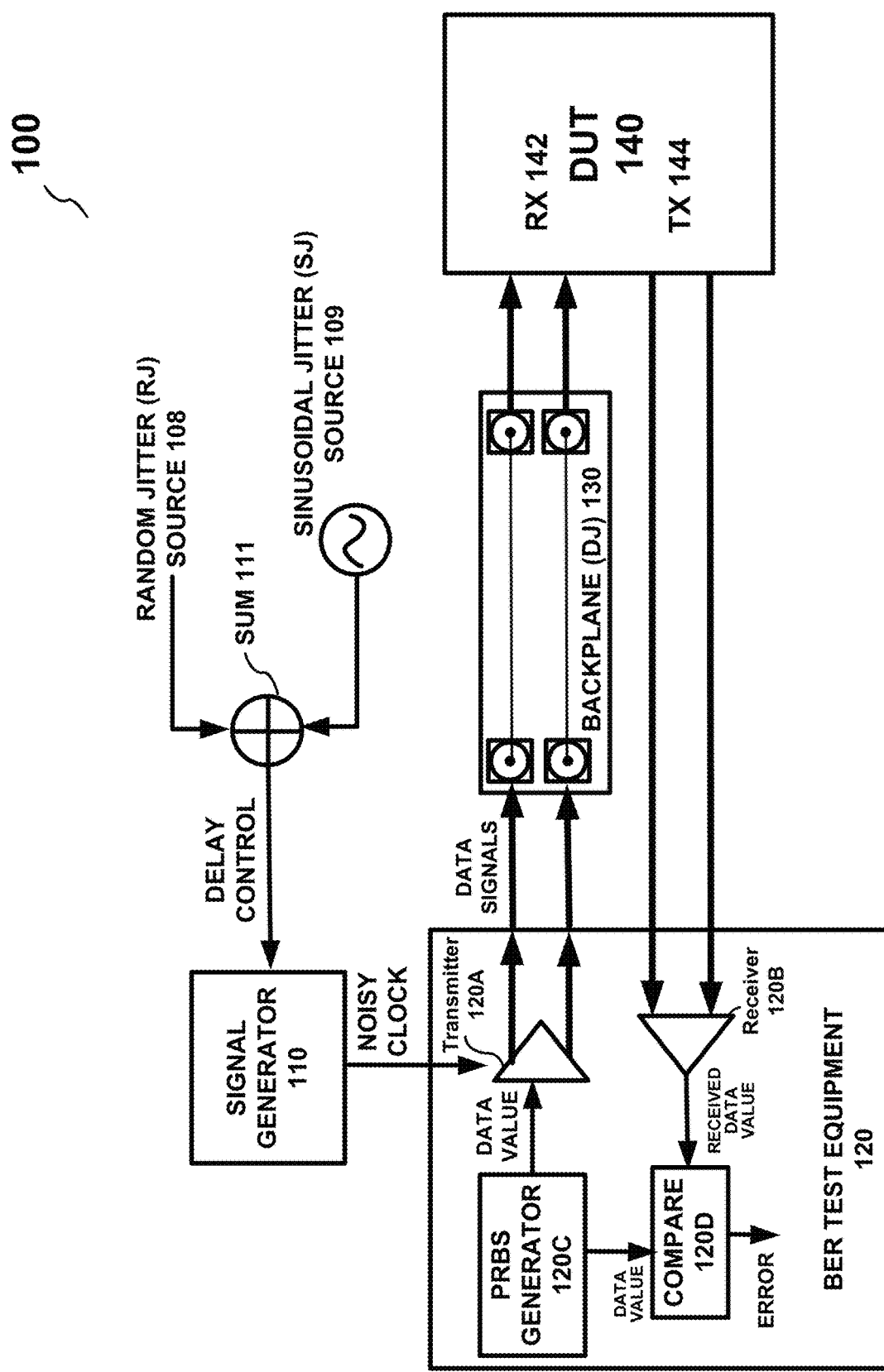
FIG. 1 illustrates a conventional test system.
Figures 2, 3:
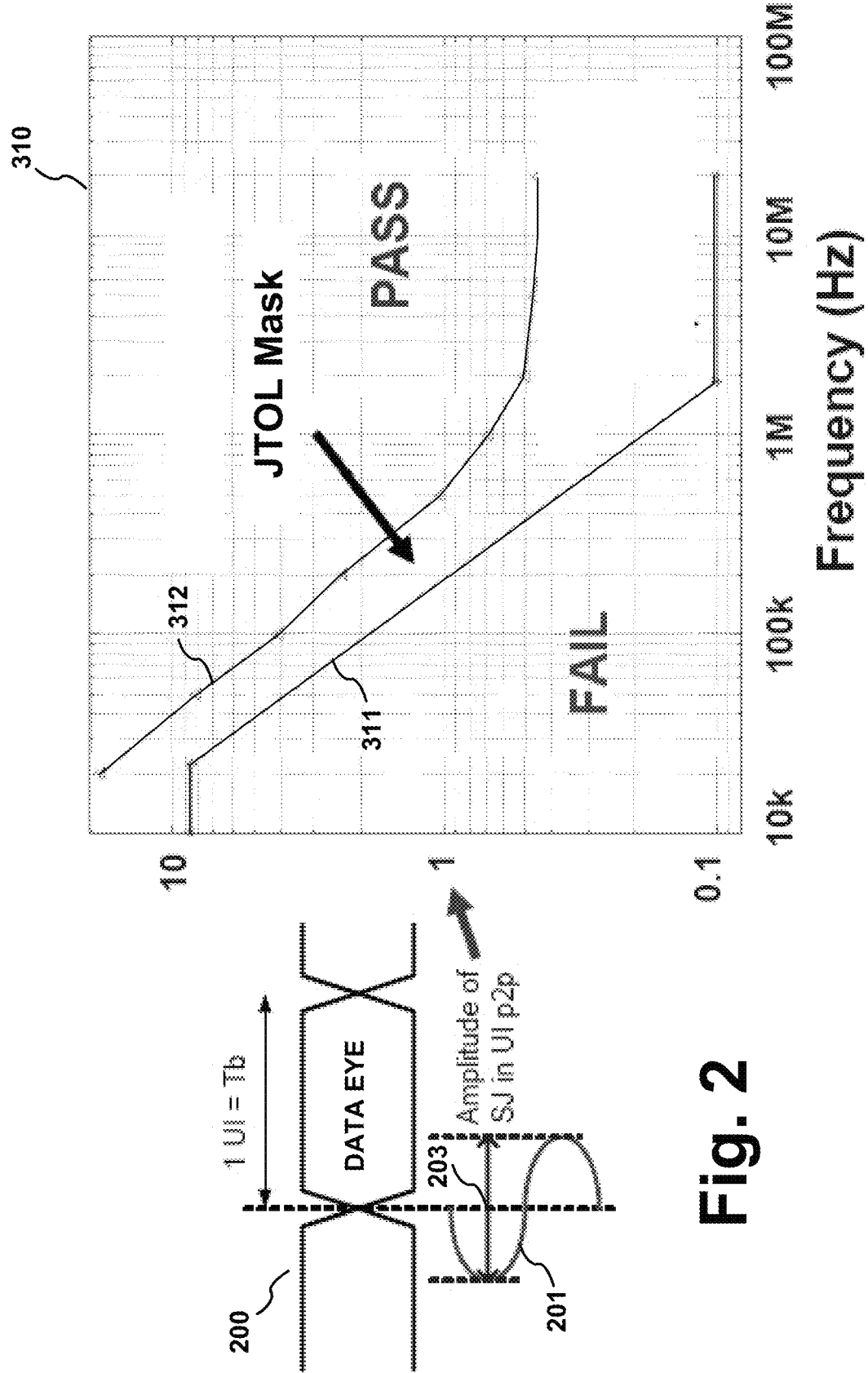
FIG. 2 illustrates the effect of SJ on a data signal.
FIG. 3 illustrates a jitter tolerance graph.

FIG. 2 illustrates the effect of adding SJ 201 having peak-to-peak amplitude 203 to a data signal 200. SJ 201 shifts the edges of the data signal 200 with respect to where the edges would have occurred in time had SJ 201 not been added. How far the edges are disturbed is related to the amplitude of the SJ 201. How quickly this disturbance varies is related to the frequency of the SJ 201. In this FIG. 2, "UI" denotes a 1 unit interval and may represent a nominal time period of a bit or an interval of time for receiving a data signal in an embodiment.

FIG. 3 illustrates a JTOL graph 310. In this example, at a given frequency of the SJ (e.g. 1 MHz), the peak-to-peak ("p2p") amplitude of the SJ is increased until the RX's measured BER degrades to a target BER. This target BER is typically $10^{-12}$ or $10^{-15}$ depending on product specification or industry standard. The frequency of the SJ is the x-axis of the graph 310 and the p2p amplitude at which the target BER occurs is recorded in the y-axis. This measurement repeats over various SJ frequencies and generates a curve 312. In this example, the amount of RJ is constant. Furthermore in this example, curve 311 ("JTOL Mask") denotes a minimum SJ that the RX must tolerate before degrading to the target BER in order to pass the industry specification (e.g. XAUI). Hence, the measured curve 312 being above curve 311 would be characteristic of a good IC part. This is simply an illustrative example and there are other variants of defining JTOL. For instance, another specification may require JTOL measured with the SJ having a fixed frequency and amplitude while the RJ amplitude is increased. In almost all JTOL evaluation, a means of generating a variable SJ and RJ is needed for characterizing the performance of a RX.

Embodiments of the present disclosure include on-chip circuits that can generate SJ with variable amplitude and frequency and RJ with variable amplitude. Such on-chip circuits eliminate or reduce the need for expensive specialized test equipment and reduce the time required for manufacturing/testing an integrated circuit.

An integrated circuit ("IC"), among other embodiments, includes one or more jitter generator circuits to output at least one jitter signal so that at least one receive clock signal is adjusted (or is noisy). A jitter signal, such as an SJ or RJ signal, may be input to a Clock and Data Recovery ("CDR") circuit coupled to one or more receivers that obtain data values and edge values from an input signal. An input signal is sampled by a receiver circuit using the adjusted receive clock signal to obtain a received data value. A stored (or expected/predetermined) data value is input, along with the received data value, to a compare circuit that outputs an error signal when the received data value does not match or equal the stored expected data value. The stored data values may be output by a data generator circuit, such as a PRBS generator circuit. The error signals may be input to a counter that stores a count value that represents a performance metric/tolerance of the IC, such as a BER value, for a particular jitter signal. A control circuit may output control signals to initialize one or more jitter generator circuits and to synchronize the compare circuit.

In an embodiment, an IC operates in a first and second mode of operation. In the first mode of operation (or a test/calibrate/initialization mode), a jitter signal is generated in response to a control signal and used to adjust a receive clock signal. Received data values using the adjusted or noisy receive clock signal are then compared to predetermined data values so that a BER value may be obtained or jitter tolerance may be measured. In the second mode of operation (or typical/normal mode), a jitter signal is not generated in response to the control signal and data values are sampled or received using a receive clock signal that does not include a jitter signal.

In further embodiments, jitter generator circuits include circuits that provide approximate SJ, SJ and RJ signals to a CDR circuit that in turn outputs adjusted (noisy) receive clock signals to receiver circuits. A circuit may also be included that provides a frequency offset to at least one receive clock signal.

In an exemplary embodiment, an IC includes a plurality of receiver circuits coupled to a CDR circuit and one or more jitter generator circuits. A first receiver circuit samples an input signal to obtain a data value in response to a data clock signal. A second receiver circuit samples the input signal to obtain an edge value in response to an edge clock signal. The CDR circuit includes a phase detector coupled to the first and second receiver circuits. The phase detector outputs an adjust signal (via a $K_i$ multiply circuit) to a frequency accumulator that outputs a frequency signal. A sum circuit outputs a sum of the frequency signal and the adjust signal (via a $K_p$ multiply circuit) to the phase accumulator that outputs a phase signal. A clock alignment circuit, such as a phase lock loop ("PLL") or delay lock loop ("DLL"), in the CDR circuit receives a reference clock signal so that a plurality of clock signals are output to a phase interpolator that generates the data and edge clock signals whose phase is responsive to the output of the phase accumulator. One or more jitter generator circuits, such as a square wave generator circuit, binary counter and storage circuit or PRBS circuit, output jitter signals to the CDR circuit so that the receive clock signal is adjusted during a mode of operation that determines jitter tolerance.

Figure 4:
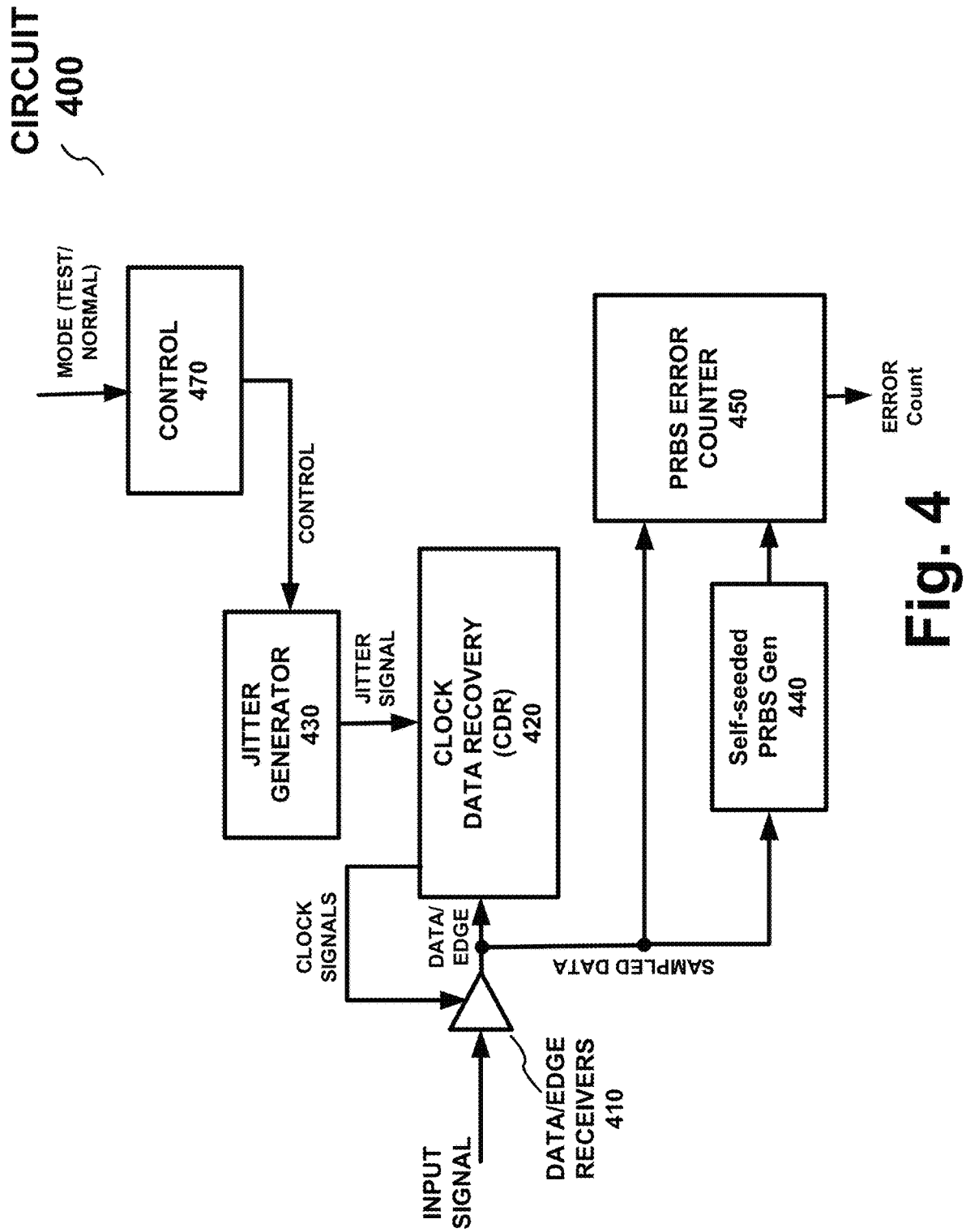
FIGS. 4-8 illustrate circuits having receiver jitter tolerance measurement capabilities according to various embodiments.

FIG. 4 illustrates a circuit 400 including data/edge receivers 410, clock and data recovery ("CDR") 420, control 470 and jitter generator 430, among other circuit components, according to embodiments. Jitter generator 430 outputs an SJ and/or RJ signal to CDR 420. In an embodiment, jitter generator 430 outputs a jitter signal having controlled characteristics, such as a controlled predetermined wave shape, amplitude and/or frequency, singly or in combination. FIGS. 5-8 illustrate embodiments of providing SJ and RJ signals to a CDR circuit as well as providing a frequency offset. CDR 420 outputs a clock signal that has been adjusted (or a noisy clock signal) in response to the jitter signal output from jitter generator 430. Accordingly, one or more of the receivers in data/edge receivers 410 sample data and/or edge values in response to one or more clock signals that have noise or jitter added.

In embodiments, data/edge receivers 410 may be included in CDR 420. In embodiments, two data and two edge receivers sample an input signal to output two data and two edge values in response to two data and two edge clocks output from CDR 420. The four clock signals may be respectively offset by ninety degrees.

Figure 5:
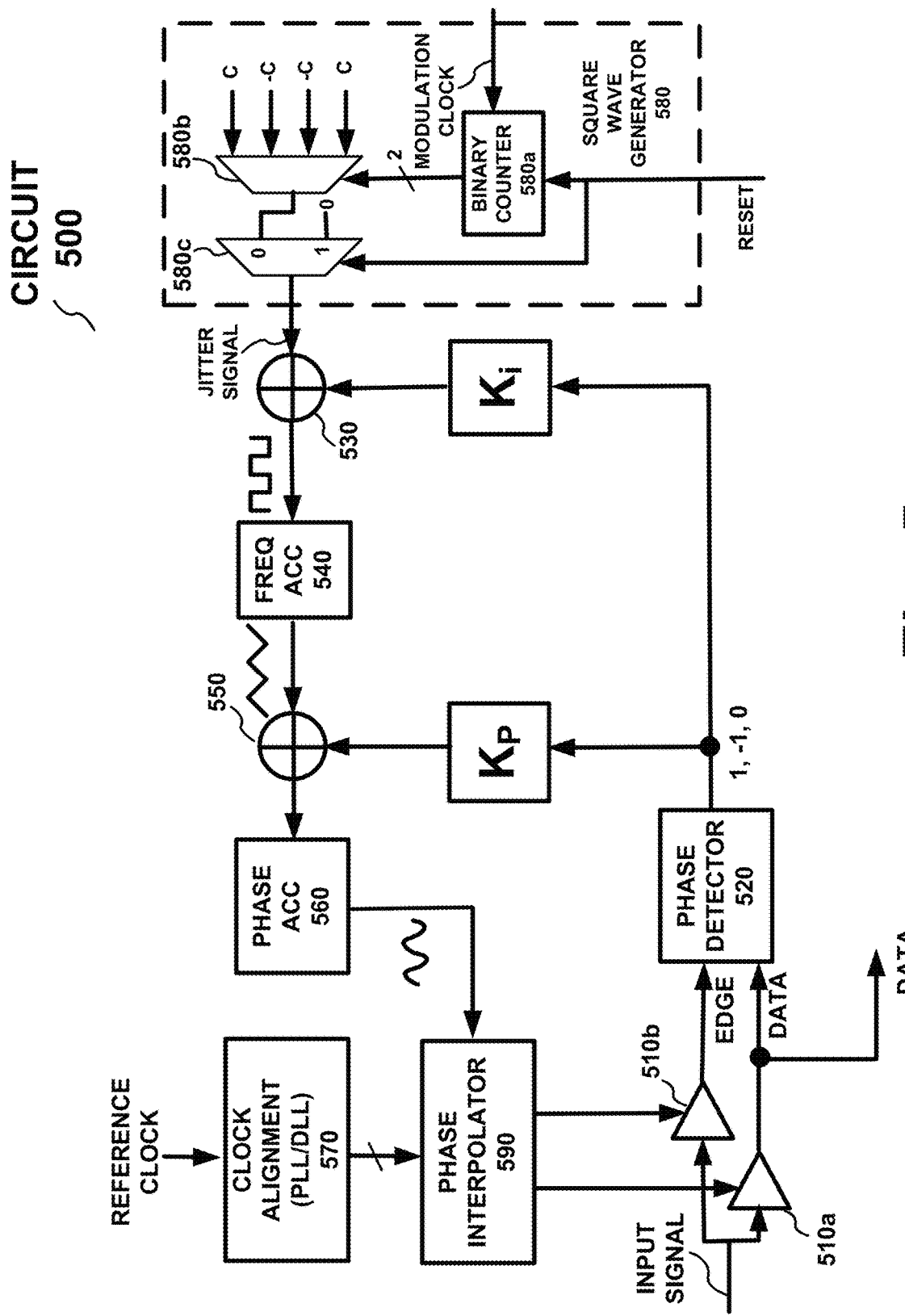
Figure 6:
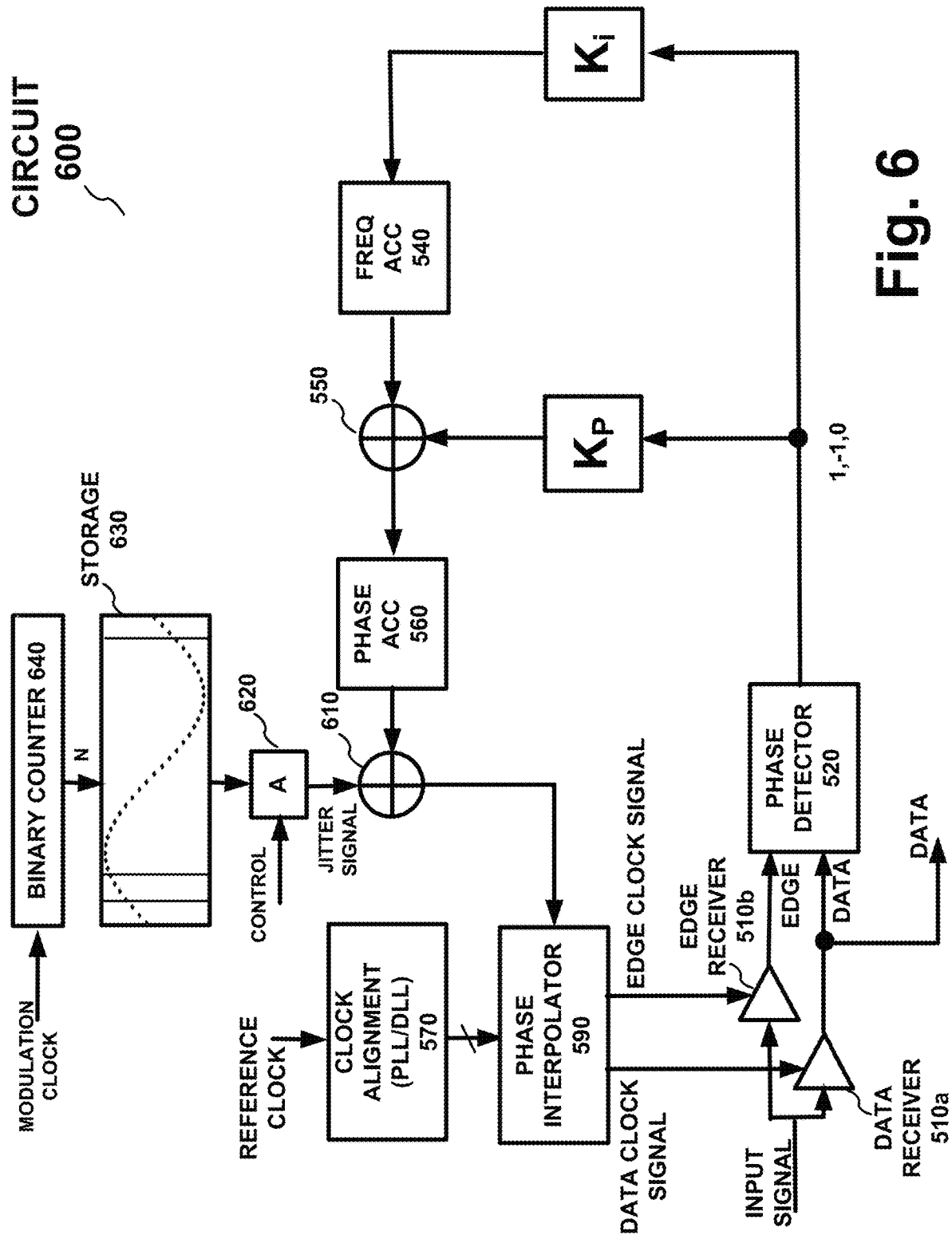
Figure 7:
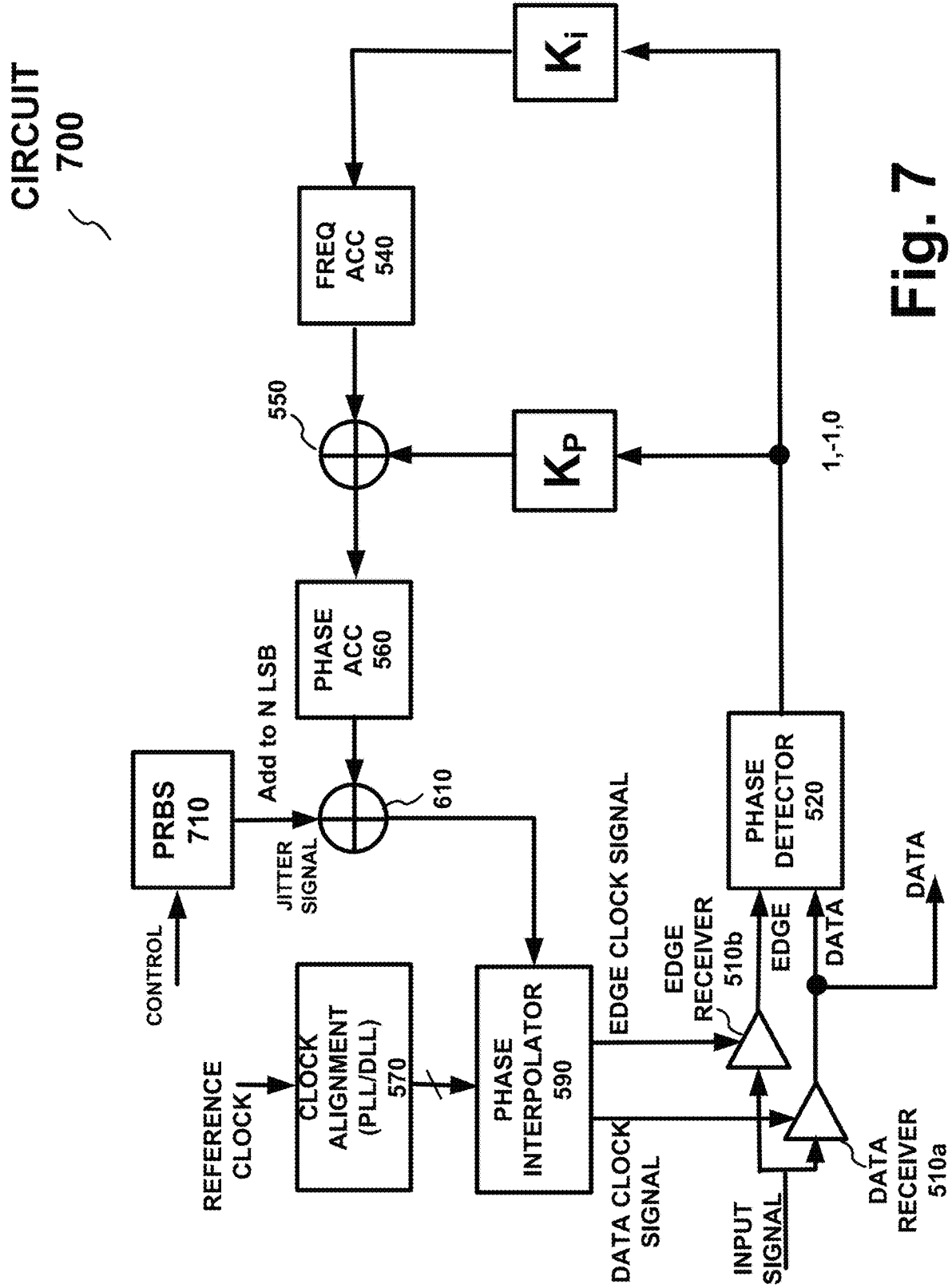

More than one jitter generator 430, as illustrated in FIGS. 5-7, may be used to provide different types of jitter signals (DJ, RJ and SJ) at the same time.

Data values from data/edge receivers 410 may be output to a PRBS error counter 450 which may be used in conjunction with another counter (not shown) to record the number of data values or bits received, from which BER can be calculated. In embodiments, an error signal and/or count values may be provided to a register interface (not shown). Data values are also output from data/edge receivers 410 to self-seeded PRBS generator 440 which outputs a set of expected or known data values to PRBS error counter 450 in response to the sampled data values. A number of erroneous bits (error count) is obtained by the PRBS error counter 450 comparing the sampled data values to the output of the self-seeded PRBS generator 440. The error count then may be divided by the total number of bits received to calculate a BER value. A number of total bits received may be calculated in software by multiplying a bit rate (bits/sec) with an observation time (in seconds). A general purpose-processing device that includes software, such as personal computer, may access the count and/or error values from the register interface (or counters) to calculate a BER value in embodiments.

In embodiments, control 470 outputs control signals to jitter generator 430 in response to a mode (test/normal) signal. In embodiments, a mode signal indicates whether circuit 400 operates in a test/calibration/initialization mode or typical/normal mode of operation. A mode signal may be generated internally in response to a digital value indicating a mode of operation stored in a storage circuit, or register, or provided from an external source, such as from a programmable fuse or external bus/interconnect. For example, a mode signal may be generated in response to values received from an input signal at data/edge receivers 410. In embodiments, control 470 provides constant values, reset signals and/or synchronization signals to circuit 400, including jitter generator 430 in response to the mode signal. In an embodiment, control 470 may be external to circuit 400.

FIG. 5 illustrates a circuit 500 which is an exemplary embodiment of circuit 400. Circuit 500 includes a CDR circuit that includes a phase detector 520, multiplier circuits $K_p$ and $K_i$, sum circuits 530 and 550, a frequency ("freq") accumulator ("acc") 540, a phase acc 560, a clock alignment circuit 570 (such as a PLL/DLL circuit) and a phase interpolator 590. A square wave generator 580 that corresponds to jitter generator 430 outputs a jitter signal in the form of a square wave to sum circuit 530. Data and edge receivers 510a and 510b correspond to data/edge receivers 410. In alternate embodiments, other circuit components may be included in circuit 500, such as loop filters, equalizer circuits and de-serializer circuits. In embodiments, portions of circuit 500 are included in a digital circuit, such as a field programmable gate array ("FPGA") that outputs analog values by a digital-to-analog converter. For example, multiplier circuits $K_p$ and $K_i$, sum circuits 530 and 550, freq acc 540, phase acc 560, clock alignment circuit 570 and phase interpolator 590 may be included in a digital circuit.

In an operation of circuit 500, an input signal is sampled by data receiver 510a and edge receiver 510b, which output data and edge values in response to a data clock signal and an edge clock signal, respectively. As described above, more receivers and clock signals may be used to sample the input signal in other embodiments. Edge and data values are input to a phase detector 520 to determine the relative time/phase between the input signal and the receive clock signals and to output an up/down/hold signal to multiplier circuits $K_p$ and $K_i$. In an embodiment, an up/down/hold signal is a two bit digital signal represented as 1, −1, and 0 in 2's complement binary. Multiplier circuits $K_p$ and $K_i$ multiply the up/down/hold signals by respective constants (such as a proportional and integral constant) and outputs the products to inputs of sum circuits 550 and 530. Freq Acc 540 provides another input (a frequency signal) to sum circuit 550 that outputs a sum of the inputs to phase acc 560. Square wave generator 580 outputs a jitter signal to another input of sum circuit 530 that outputs a sum of the inputs to freq Acc 540. Phase acc 560 outputs a phase signal to phase interpolator circuit 590 in response to the output of sum circuit 550. Clock alignment circuit 570 may be a PLL or DLL circuit that provides a plurality of clock signals to a phase interpolator 590 in response to a reference clock signal. In embodiments, the reference clock signal may be provided external to circuit 500 or generated internally. Phase interpolator 590 outputs at least data and edge clock signals to data and edge receivers 510a-b in order to synchronize the sampling of the data and edge values. Inputting a jitter signal into sum circuit 530 enables at least one of the data and clock signals to be adjusted (or summed with a jitter signal) so that jitter tolerance may be measured.

Square wave generator 580 outputs a jitter signal in the form of a square wave signal to sum circuit 530. This disturbance when passing through Freq acc 540 becomes a triangle wave. This triangle wave after passing through Phase acc 560 emulates approximately an SJ signal composed of parabolas. By introducing (or adding) this approximate SJ signal to phase interpolator 590, the receive clock signals are adjusted so that jitter tolerance may be measured. An amplitude and frequency of the approximate SJ signal may be determined by inputs to square wave generator 580.

In an embodiment, square wave generator 580 includes a binary counter 580a, a selector 580b, such as a multiplexer, and a multiplexer 580c for setting/disabling the test mode. Selector 580b outputs a selected constant value (C, −C, −C, C) as an input to sum circuit 530 in response to an output from binary counter 580a. Constant values (C, −C, −C, C) may be stored and output from a storage circuit or register in a control circuit, such as control 470. In an embodiment, constant values (C, −C, −C, C) may be provided by an external source, such a controller or test equipment, during testing, initialization or during calibration mode of operation. The magnitude of C determines the amplitude of the SJ. An output of binary counter 580a is timed by a modulation clock. The relationship between the SJ frequency and the modulation clock frequency is determined by the 2 bits from the binary counter 580a that are used to control selector 580b. When the least significant two bits are used, the SJ frequency is 4 times slower than the modulation clock frequency. If an eight bit counter is used and the two most significant bits are used to control the selector 580b, then the SJ frequency is 1/256 times the modulation frequency. In an embodiment, square wave generator 580 receives a reset signal from the control circuit in order to initiate the timing of the output of the jitter signal. For example, a reset signal may zero out or initialize binary counter 580a. This reset signal is used so as to avoid un-intentionally adding a frequency offset in addition to the SJ. Furthermore, the reset signal is input to multiplexer 580c to zero out the jitter input during normal operation. Accordingly, the constant values (C, −C, −C, C) determine the amplitude of the jitter signal and the binary counter output determines the frequency of the SJ signal caused by the square wave generator 580.

FIG. 6 illustrates circuit 600 which is an exemplary embodiment of circuit 400. Circuit 600 includes similar circuits shown in FIG. 5 and operates similarly to circuit 500. However, circuit 600 includes a jitter circuit generator that includes binary counter 640, storage circuit 630, multiplier circuit A and sum circuit 610. Storage circuit 630 includes $2^N$ stored digital values representing a sinusoidal signal having predetermined amplitude. Digital sinusoidal values are output from storage circuit 630 in response to binary counter 640 that outputs the N bit address signal in response to a modulation clock. Not shown is a decoder that uses the N bit address to select one entry from the storage at a time. How fast the digital values in storage circuit 630 are traversed (output) determines the frequency of the jitter signal (or SJ signal). An amplitude of the digital sinusoidal signal output from storage circuit 630 may be adjusted by applying a multiplier A whose output is modulo 1UI to the output of storage circuit 630. In an embodiment, the amplitude or scalar of multiplier circuit A may be adjusted in response to a control signal from a control circuit, such as control 470 shown in FIG. 4. Sum circuit 610 sums the output of multiplier circuit A and the output of phase acc 560 and provides a sum to clock alignment circuit 570. Accordingly, circuit 600 adjusts at least one of data and edge clock signals so that BER values for particular jitter signals having predetermined amplitude and frequency or tolerances may be measured.

Circuits 500 and 600 are similar in that they can provide close to sinusoidal jitter signals having amplitudes of several UI that may be needed in tests that use low frequency SJ signals. In an embodiment, circuit 600 generates other types of periodic jitter signals, such as square wave jitter, by only changing the contents of storage 630.

FIG. 7 illustrates circuit 700 which is an exemplary embodiment of circuit 400. Circuit 700 includes similar circuits shown in FIG. 6 and operates similarly to circuit 600. However, circuit 700 includes a jitter circuit generator that outputs an RJ signal instead of an SJ signal. Circuit 700 includes a PRBS 710 instead of (or in addition to) the circuits that provide the SJ signal in circuits 500 and 600.

An RJ signal is emulated by a PRBS 710 that outputs a predetermined random bit pattern/sequence (via sum circuit 610) to N least significant bits ("LSBs") of the output of phase acc 560. Sum circuit 610 outputs a sum of the output of phase acc 560 and the output of PRBS 710 (N LSBs) to phase interpolator 590. A number of LSBs (N) that will be modulated by the output of PRBS 710 may be determined by the intended amount of p2p RJ signal to be added. In an embodiment, a control signal from a control circuit, such as control 470, selects which N LSBs of the phase acc 560 the PRBS 710 output should be summed with.

Figure 8:
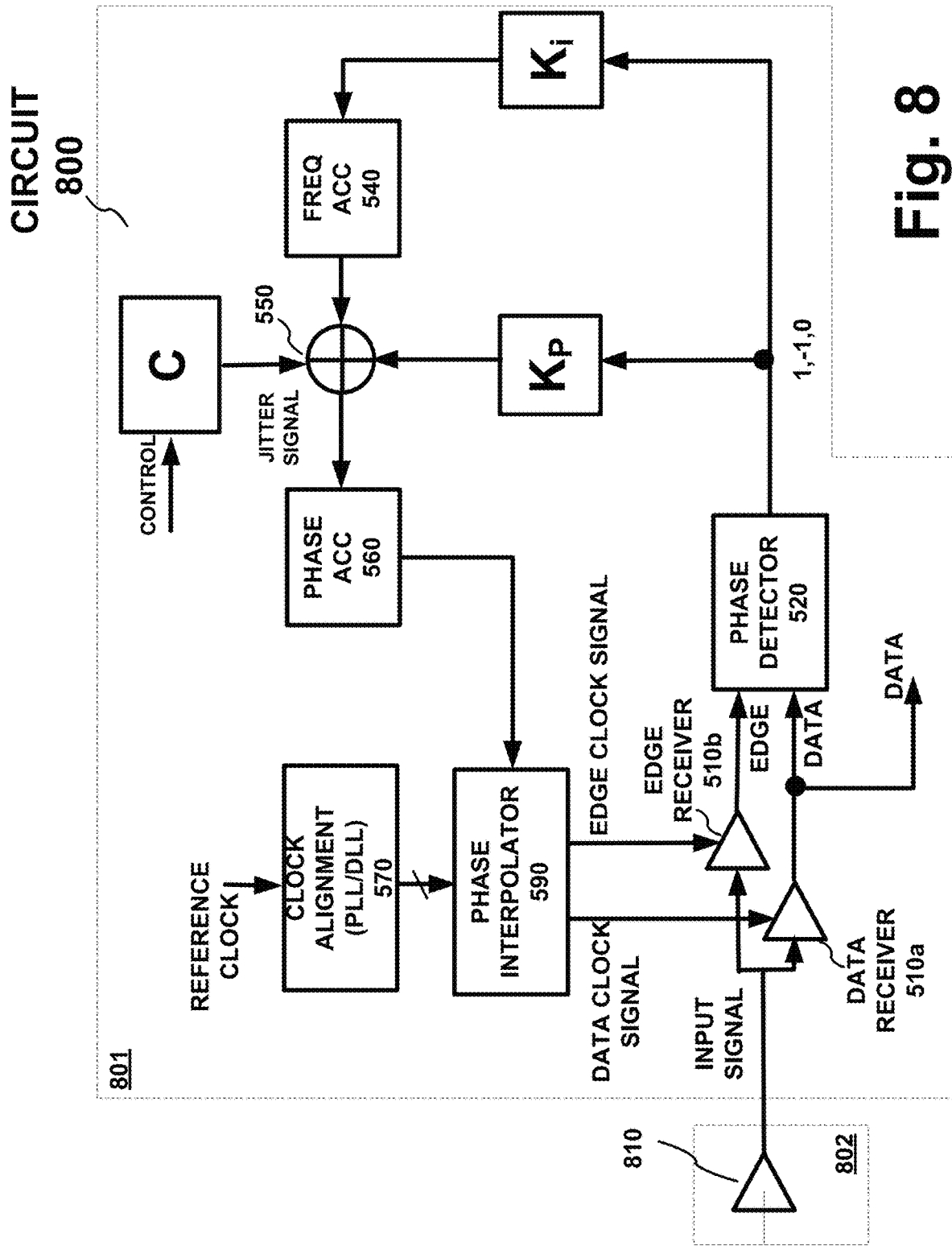

FIG. 8 illustrates circuit 800 which is an exemplary embodiment of circuit 400. Circuit 800 enables evaluation of the performance of an integrated circuit 801 including circuit 800 in the situation of a frequency offset between a transmitter 810 in another integrated circuit 802 and a receiver in integrated circuit 801 without actually causing such a frequency offset. In other words, the evaluation can be performed when the transmitter and the receiver of the input signal are using a same reference clock. Circuit 800 includes similar circuits shown in FIG. 7 and operates similarly to circuit 700. However, circuit 800 includes a constant C that forces a frequency offset at the input of phase acc 560 (via sum circuit 550) instead of an SJ and/or RJ signal. Circuit 700 includes a constant C instead of (or in addition to) the circuits that provide the SJ/RJ signals in circuits 500, 600 and 700. Constant C provides a selected frequency offset to an input of sum circuit 550 in response to a control signal that may be provided by a control circuit. The control signal may indicate the amount of frequency offset to be added.

Figure 9:
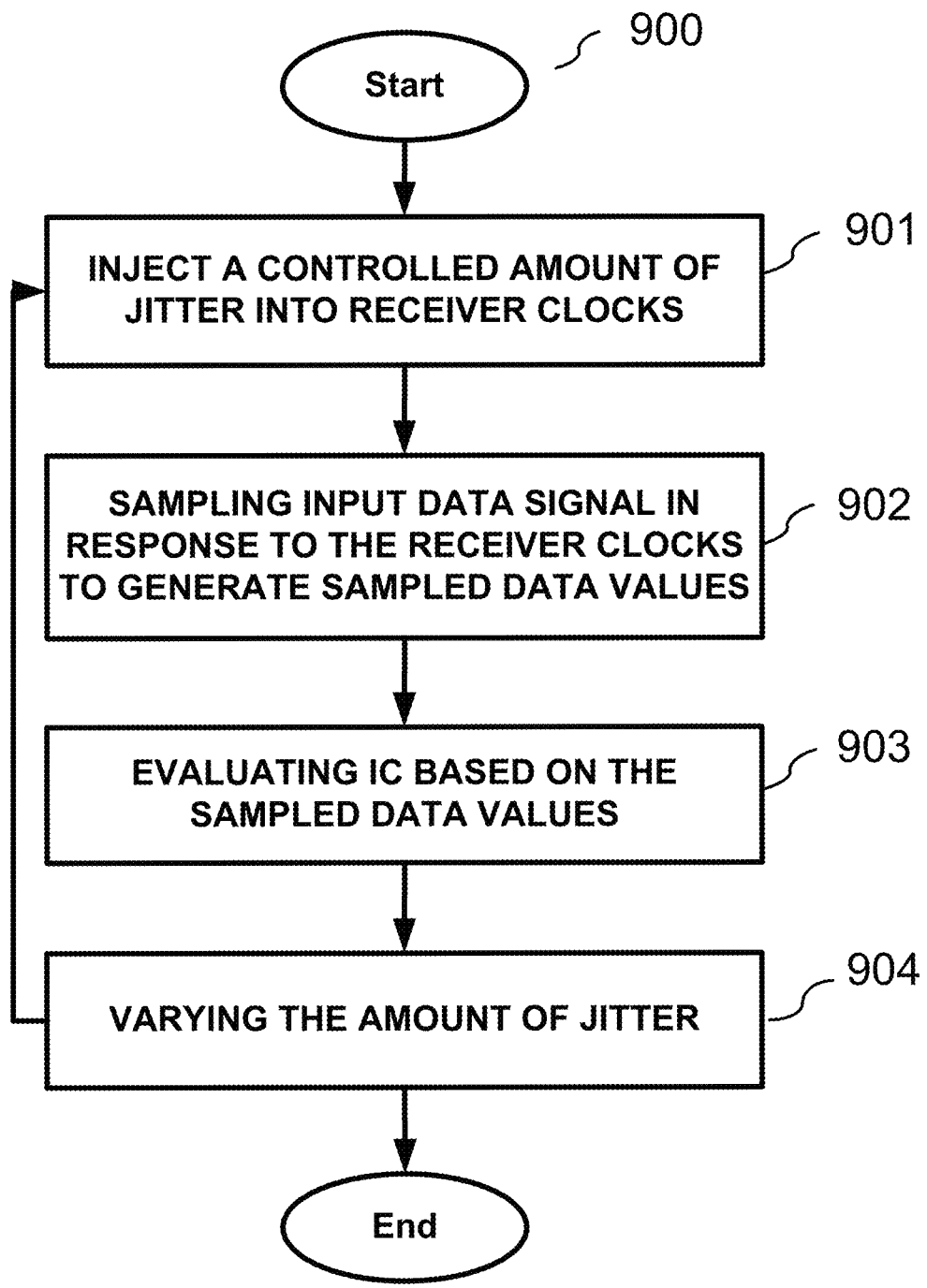
FIG. 9 is a flow chart to illustrate a method for on-chip jitter tolerance measurement according to embodiments.

FIG. 9 illustrates a method 900 for evaluating an IC by adding jitter into at least one receive clock signal and/or measuring a BER value/jitter tolerance. In embodiments, logic blocks illustrated in FIG. 9 illustrate operations/functions of circuits, software or a user, singly or in combination. In embodiments, one or more circuits shown in FIGS. 4-8 carry out method 900. Logic blocks that are not shown may be included in various embodiments; similarly, logic blocks that are shown may be excluded in various embodiments. Also, while method 900 is described in sequential logic blocks, logic blocks of method 900 may be completed concurrently in embodiments.

Method 900 includes the steps of adding a controlled amount of jitter to at least one receive clock signal (901), sampling an input signal to generate sampled data values in response to the at least one receive clock signal (902), and evaluating the IC based on the sampled data values (903). In one embodiment, evaluating the IC includes computing a bit error ratio corresponding to the controlled amount of jitter. Method 900 may further include varying the amount of jitter (904) and repeating steps 901-903 with the varied amount of jitter.

In one embodiment, the IC includes a clock circuit for generating the at least one receive clock signal and the step of adding includes generating at least one jitter signal, and injecting the at least one jitter signal into a clock circuit. As discussed above, the at least one jitter signal may be one or more of a substantially square-wave signal, a substantially triangular wave signal, a digital/substantially sinusoidal signal, an emulated random jitter signal, a constant C signal, and any other suitable jitter signal. Each jitter signal has a controllable frequency and/or controllable amplitude, which may be varied in step 904.

Integrated circuits described herein may be included in various systems or subsystems such as personal computers, graphics cards, set-top boxes, cable modems, cellular telephones, game consoles, digital television sets (for example, high definition television ("HDTV")), fax machines, cable modems, digital versatile disc ("DVD") players or network routers. Integrated circuits described herein may be housed in a variety of different types of packages having different types of external contacts.

In embodiments, conductive paths described herein may include one or a plurality of wires and/or metal traces/regions/signal lines. Multiple conductive paths may replace a single conductive path illustrated in the figures and a single conductive path may replace multiple conductive paths illustrated in the figures.

It should be noted that the various circuits disclosed herein may be described using computer aided design tools and expressed (or represented) as data and/or instructions embodied in various computer-readable media, in terms of their behavior, register transfer, logic component, transistor, layout geometries, and/or other characteristics. Formats of files and other objects in which such circuit expressions may be implemented include, but are not limited to: formats supporting behavioral languages such as C, Verilog, and HLDL; formats supporting register level description languages like RTL; formats supporting geometry description languages such as GDSII, GDSIII, GDSIV, CIF, MEBES; and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). When received within a computer system via one or more computer-readable media, such data and/or instruction-based expressions of the above described circuits may be processed by a processing entity (e.g., one or more processors) within the computer system in conjunction with execution of one or more other computer programs including, without limitation, netlist generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

The foregoing description of the preferred embodiments has been provided for the purposes of illustration and description. It is not intended to be exhaustive or to limit the embodiments to the precise forms disclosed. Modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A method of operating an integrated circuit, the method comprising:
    with a receiver, sampling, at respective sampling times, a signal carrying a sequence of digital symbols, and to produce respective data samples;
    controllably varying the sampling times so as to simulate effects of a controlled amount of jitter on the signal;
    comparing the respective data samples with expected data; and
    generating data reflecting a bit error rate in the signal in dependence on results of the comparing.

2. The method of claim 1 wherein the method further comprises:
    calculating a bit error rate (BER) value;
    storing, in a register, the calculated BER value; and
    providing the BER value to an accessing processor.

3. The method of claim 1 wherein:
    the integrated circuit has circuitry to supply a data pattern, the expected data corresponding to the data pattern; and
    the data pattern is to match data symbols of the sequence of data symbols.

4. The method of claim 1 wherein the controlled amount of jitter can represent sinusoidal jitter and wherein the method further comprises controllably varying the sinusoidal jitter in terms of each of frequency and amplitude.

5. The method of claim 1 wherein:
    the method further comprises generating a sampling clock in response to one or more jitter control signals; and
    the sampling clock is to define the respective sampling times.

6. The method of claim 5 wherein the integrated circuit has at least one of a phase locked loop and a phase interpolator and wherein the method further comprises controlling the at least one of the phase locked loop and the phase interpolator as a function of the one or more jitter control signals.

7. The integrated circuit of claim 1 wherein the signal is to convey timing representing an embedded clock and wherein the method further comprises:
    generating a recovered clock in dependence on the timing representing the embedded clock;
    providing the receiver with a sampling clock dependent on the recovered clock, the respective sampling times being defined by transitions of the sampling clock; and
    injecting timing offsets into at least one of the recovered clock or the sampling clock so as to simulate the effects of the controlled amount of jitter on the signal.

8. The method of claim 7 wherein the integrated circuit comprises at least one accumulator circuit and wherein:
    the method further comprises adding values representing the timing offsets to the accumulator circuit; and
    the sampling clock is dependent on an output of the accumulator circuit.

9. The method of claim 1 wherein the controlled amount of jitter corresponds to at least one of sinusoidal jitter, random jitter and deterministic jitter.

10. The method of claim 9 wherein:
    the method further comprises generating one or more jitter control signals, the one or more jitter control signals to carry at least one predetermined pattern of control values; and
    the at least one predetermined pattern of values represent the at least one of sinusoidal jitter, random jitter and deterministic jitter.

11. An integrated circuit comprising:
    a receiver to sample, at respective sampling times, a signal carrying a sequence of digital symbols, and to produce respective data samples;
    circuitry to controllably vary the sampling times so as to simulate effects of a controlled amount of jitter on the signal; and
    circuitry to compare the respective data samples with expected data and to generate data reflecting a bit error rate in the signal in dependence on the comparison.

12. The integrated circuit of claim 11 wherein:
    the integrated circuit further comprises a register and circuitry to calculate a bit error rate (BER) value;
    the register is to store the BER value calculated by the circuitry to calculate; and
    the integrated circuit comprises an interface to provide the BER value to an accessing processor.

13. The integrated circuit of claim 11 wherein:
    the integrated circuit further comprises a circuitry to supply a data pattern, the expected data corresponding to the data pattern; and
    the data pattern is to match data symbols of the sequence of data symbols.

14. The integrated circuit of claim 11 wherein the controlled amount of jitter is to represent sinusoidal jitter that is controllably varied in terms of each of frequency and amplitude.

15. The integrated circuit of claim 11 wherein:
    the circuitry to controllably vary comprises circuitry to generate a sampling clock in response to one or more jitter control signals; and
    the sampling clock is to define the respective sampling times.

16. The integrated circuit of claim 15 wherein:
    the circuitry to generate the sampling clock comprises at least one of a phase locked loop and a phase interpolator; and
    operation of the at least one of the phase locked loop and the phase interpolator is to be controlled as a function of the one or more jitter control signals.

17. The integrated circuit of claim 11 wherein the signal is to convey timing representing an embedded clock and wherein:
    the integrated circuit further comprises circuitry to generate a recovered clock;
    the receiver is to receive a sampling clock dependent on the recovered clock, the respective sampling times being defined by transitions of the sampling clock; and
    the circuitry to controllably vary the sampling times is to inject timing offsets into at least one of the recovered clock or the sampling clock so as to simulate the effects of the controlled amount of jitter on the signal.

18. The integrated circuit of claim 17 wherein:
the circuitry to generate the recovered clock comprises at one accumulator circuit;
the circuitry to controllably vary the sampling times is to cause addition of values representing the timing offsets at least one value held by the accumulator circuit; and
the sampling clock is dependent on an output of the accumulator circuit.

19. The integrated circuit of claim 11 wherein the controlled amount of jitter corresponds to at least one of sinusoidal jitter, random jitter and deterministic jitter.

20. The integrated circuit of claim 19 wherein the integrated circuit comprises circuitry to generate one or more jitter control signals and wherein the one or more jitter control signals are to carry at least one predetermined pattern of control values, the at least one predetermined pattern of values representing the at least one of sinusoidal jitter, random jitter and deterministic jitter.

\* \* \* \* \*